(12) United States Patent
Abali et al.

(10) Patent No.: US 8,909,897 B2
(45) Date of Patent: *Dec. 9, 2014

(54) METHOD FOR GENERATING A DELTA FOR COMPRESSED DATA

(71) Applicant: International Business Machines Corporation, Armonk, NY (US)

(72) Inventors: Bulent Abali, Tenafly, NJ (US); James A. Marcella, Rochester, MN (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 37 days.

This patent is subject to a terminal disclaimer.

(21) Appl. No.: 13/692,992

(22) Filed: Dec. 3, 2012

(65) Prior Publication Data

US 2014/0075150 A1    Mar. 13, 2014

Related U.S. Application Data

(63) Continuation of application No. 13/609,437, filed on Sep. 11, 2012.

(51) Int. Cl.
  *G06F 12/00* (2006.01)
  *G06F 12/10* (2006.01)
(52) U.S. Cl.
  CPC .................................... *G06F 12/10* (2013.01)
  USPC ........................... 711/202; 711/156; 711/206
(58) Field of Classification Search
  USPC ........................................ 711/206, 156, 202
  See application file for complete search history.

(56) References Cited

U.S. PATENT DOCUMENTS

| | | | |
|---|---|---|---|
| 2005/0131939 A1 | 6/2005 | Douglis et al. | |
| 2009/0287901 A1* | 11/2009 | Abali et al. | 711/206 |
| 2010/0121825 A1* | 5/2010 | Bates et al. | 707/692 |
| 2010/0281208 A1 | 11/2010 | Yang | |
| 2012/0016882 A1* | 1/2012 | Tofano | 707/747 |
| 2012/0143835 A1* | 6/2012 | Aronovich et al. | 707/696 |

OTHER PUBLICATIONS

IBM; "Generic Merger for Efficient Parsing and Modification of Data Blocks"; http://www.ip.com/pubview/IPCOM000152994D, May 21, 2007.
Batalden, et al.; "Compressed Sequential Data on a Fixed Block Device"; http://ww.ip.com/pubview/IPCOM000119609D, Apr. 2, 2005.
Anonymous; "Method and System for Reducing Storage Consumption Using Virtual Storage Blocks and Block-Level Virtualization and Deduplication"; http://priorartdatabase.com/, IPCOM/000194381, Mar. 22, 2010.
Tremaine, et al. IBM Memory Expansion Technology (MXT), IBM J. Res. & Dev., vol. 45 No. 2, pp. 271-285, Mar. 2001.

* cited by examiner

*Primary Examiner* — Gurtej Bansal
(74) *Attorney, Agent, or Firm* — Katherine S. Brown; Jeffrey L. Streets (57) ABSTRACT

A translation table has entries that each include a share bit and a delta bit, with pointers that point to a memory block that includes reuse bits. The share bit is set to indicate a translation table entry is sharing its memory block with another translation table entry. In addition, a translation table entry may include a private delta in the form of a pointer that references a memory fragment in the memory block that is not shared with other translation table entries, wherein the private delta references previously-stored content. When a translation table has a private delta, its delta bit is set. The private delta is generated by analyzing a data buffer for content that is similar to previously-stored content.

9 Claims, 9 Drawing Sheets

Encoded Output: (Pointer to "The", 4 chars long), (Pointer to "fox", 14 chars long)

METHOD FOR GENERATING A DELTA FOR COMPRESSED DATA

BACKGROUND

1. Technical Field

This disclosure generally relates to data compression, and more specifically relates to a memory subsystems that support data compression.

2. Background Art

Memory subsystems are known in the art that include translation tables that translate real processor addresses to physical memory addresses. Known translation tables typically include table entries that include multiple pointers to multiple memory fragments in a memory block. When the processor needs to access the memory, the processor provides a real address, which identifies a translation table entry corresponding to the real address. The translation table entry identifies the physical addresses of the memory blocks corresponding to the real address provided by the processor. In this manner, address translation is achieved between the processor's real addresses and the memory's physical addresses.

Data compression allows reducing the amount of memory needed to store a particular file. However, even after data has been compressed, there may remain multiple identical parts of the file.

BRIEF SUMMARY

A translation table has entries that each include a share bit and a delta bit, with pointers that point to a memory block that includes reuse bits. When two translation table entries reference identical fragments in a memory block, one of the translation table entries is changed to refer to the same memory block referenced in the other translation table entry, which frees up a memory block. The share bit is set to indicate that a translation table entry is sharing its memory block with another translation table entry. In addition, a translation table entry may include one or more pointers that reference fragments in a memory block that are shared with other translation table entries, along with a private delta in the form of a pointer that references a memory fragment in the memory block that is not shared with other translation table entries. When a translation table has a private delta, its delta bit is set. The private delta is generated by analyzing a data buffer for content that is similar to previously-stored content, and by providing the private delta in the form of an encoded output that references previously-stored content. A higher degree of data compression is possible because multiple translation table entries that reference identical or similar memory blocks may be combined, which frees up memory blocks that would otherwise be occupied.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and.

DETAILED DESCRIPTION

The claims and disclosure herein provide a translation table has entries that each include a share bit and a delta bit, with pointers that point to a memory block that includes reuse bits. When two translation table entries reference identical fragments in a memory block, one of the translation table entries is changed to refer to the same memory block referenced in the other translation table entry, which frees up a memory block. The share bit is set to indicate a translation table entry is sharing its memory block with another translation table entry. In addition, a translation table entry may include one or more pointers that reference fragments in a memory block that are shared with other translation table entries, along with a private delta in the form of a pointer that references a memory fragment in the memory block that is not shared with other translation table entries. When a translation table has a private delta, its delta bit is set. The private delta is generated by analyzing a data buffer for content that is similar to previously-stored content, and by providing the private delta in the form of an encoded output that references previously-stored content. A higher degree of data compression is possible because multiple translation table entries that reference identical or similar memory blocks may be combined, which frees up memory blocks that would otherwise be occupied.

Figure 1:
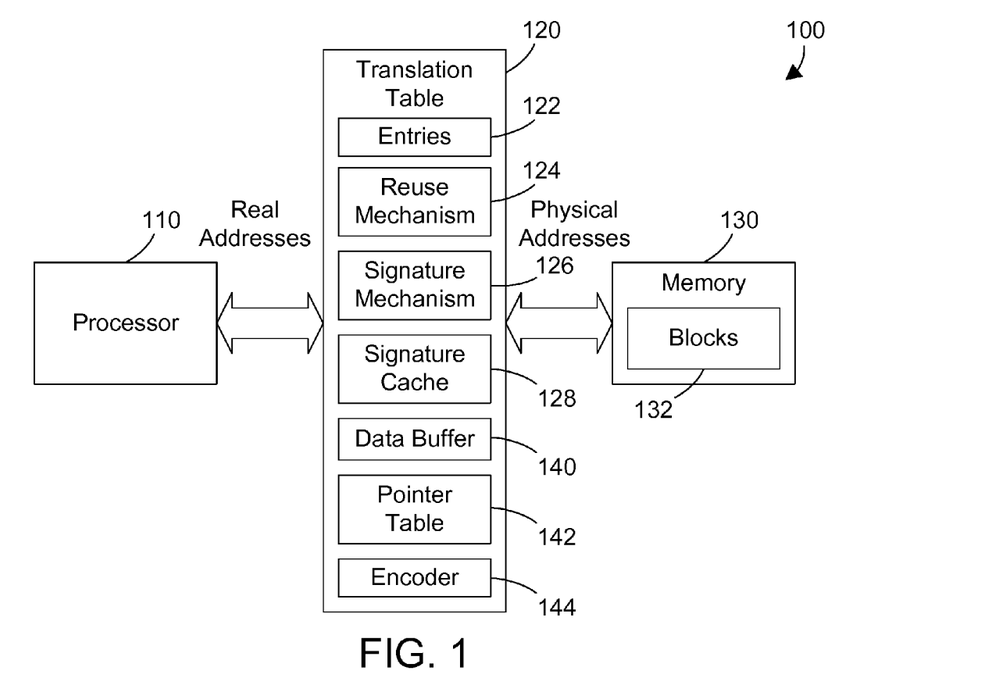
FIG. 1 is a block diagram of a system that includes a translation table that supports data compression.

Referring to FIG. 1, an apparatus 100 includes a processor 110, a translation table 120, and a memory 130. The processor 110 provides real addresses to the translation table 120, which maps the real addresses to corresponding physical addresses in the memory 130. The memory 130 includes multiple memory blocks 132 that contain data. The translation table 120 includes a plurality of entries 122, a reuse mechanism 124, and a signature mechanism 126. The reuse mechanism 124 provides increased data compression by identifying identical entries 122 in the translation table 120, then taking action to make identical entries point to the same data, thus freeing up a memory block. The signature mechanism 126 generates digital signatures for each of the translation table entries 122, which allows determining whether two translation table entries reference the same memory block by comparing the digital signatures for the two translation table entries. The functions of the reuse mechanism 124 and signature mechanism 126 are discussed in more detail below.

Figure 2:
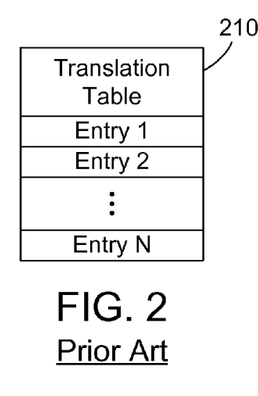
FIG. 2 is a block diagram of the translation table shown in FIG. 1.
Figure 3:
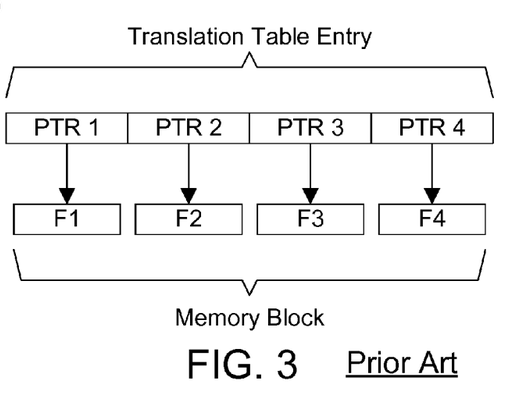
FIG. 3 is a block diagram of a prior art translation table entry that points to fragments in a memory block.

FIG. 2 shows a prior art translation table 210 that includes multiple entries, shown in FIG. 2 s Entry 1, Entry 2, . . ., Entry N. FIG. 3 shows details of one prior art translation table entry. In the example shown in FIG. 3, the translation table entry includes four pointers PTR1, PTR2, PTR3 and PTR4 that point to four corresponding memory fragments F1, F2, F3 and F4 that make up a memory block. An unneeded fragment is designated by a zero pointer. Thus, for the example in FIG. 3, if the memory block only includes the first three fragments F1, F2 and F3, the fourth pointer PTR 4 will have a zero value, which indicates the fourth fragment F4 is not needed.

In the prior art, compressing data in a memory can still result in translation table entries that reference identical data in different memory blocks. The translation table disclosed and claimed herein allows identifying translation table entries that reference identical data, and performs actions to cause multiple translation table entries to reference the same memory block, thereby freeing up one or more memory blocks and increasing the efficiency of compression.

Figure 4:
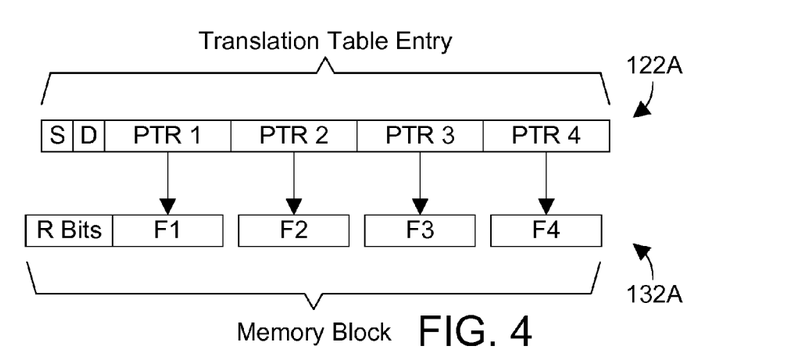
FIG. 4 is a block diagram of a translation table entry that includes a share bit and a delta bit, and a memory block that includes reuse bits.
Figure 5:
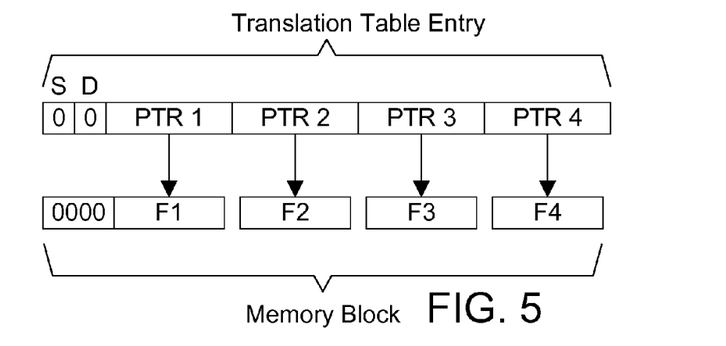
FIG. 5 is a block diagram of a non-shared translation table entry.

Referring to FIG. 4, a translation table entry 122A is an entry 122 in translation table 120 shown in FIG. 1. The translation table entry 122A includes four pointers PTR1, PTR 2, PTR 3 and PTR 4, similar to the prior art translation table entry shown in FIG. 3. However, the translation table entry 122A additionally includes a share bit and a delta bit. The memory block 132A in FIG. 4 is a block 132 in the memory 130 shown in FIG. 1. The memory block 132 includes four fragments F1, F2, F3 and F4, similar to the prior art memory block shown in FIG. 3. However, the memory block 132A in FIG. 4 additionally includes reuse bits that provide a count of the number of times the memory block is reused by translation table entries. Thus, when a memory block is not shared (reused) by any other translation table entry, the count provided by the reuse bits will be zero. FIG. 5 shows an example of a translation table entry that has its share bit and delta bit cleared, with a four-bit reuse counter all zeroes indicating the corresponding memory block is not reused (or shared) by any other translation table entry.

Figure 6:
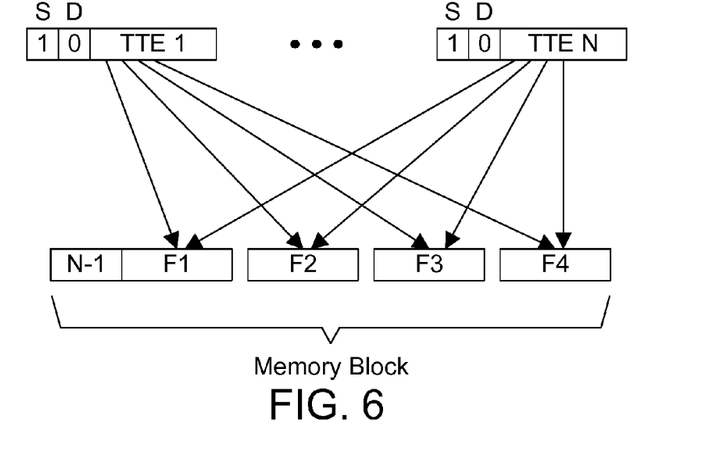
FIG. 6 is a block diagram showing N translation table entries that share a single memory block.

FIG. 6 is a graphical representation when multiple translation table entries reference the same memory block. The example in FIG. 6 assumes there are N translation table entries, shown in FIG. 10 as TTE 1, . . . , TTE N, that all reference the same memory block. In this case, the reuse bits in the memory block are set to the number N−1, which indicates that N translation table entries share the memory block.

There may be a case where a translation table entry shares most of a memory block, while having its own unique portion as well. This case is shown graphically in FIG. 7. There are multiple translation table entries TTE 1, TTE 2, . . . , TTE N that share the first three fragments F1, F2 and F3 of the memory block. However, one of the translation table entries, namely TTE 2, also references fragment 4 of the memory block. This is referred to herein as a "private delta", meaning the data that differs from other translation table entries is private to TTE 2. Because TTE 2 in FIG. 7 has a private delta as shown, TTE 2 is shown with its delta bit set. Note the reuse bits in the memory block still indicate N different translation table entries share the memory block because the reuse bits count translation table entries as sharing the memory block regardless of whether the translation table entry has a private delta or not.

Figure 8:
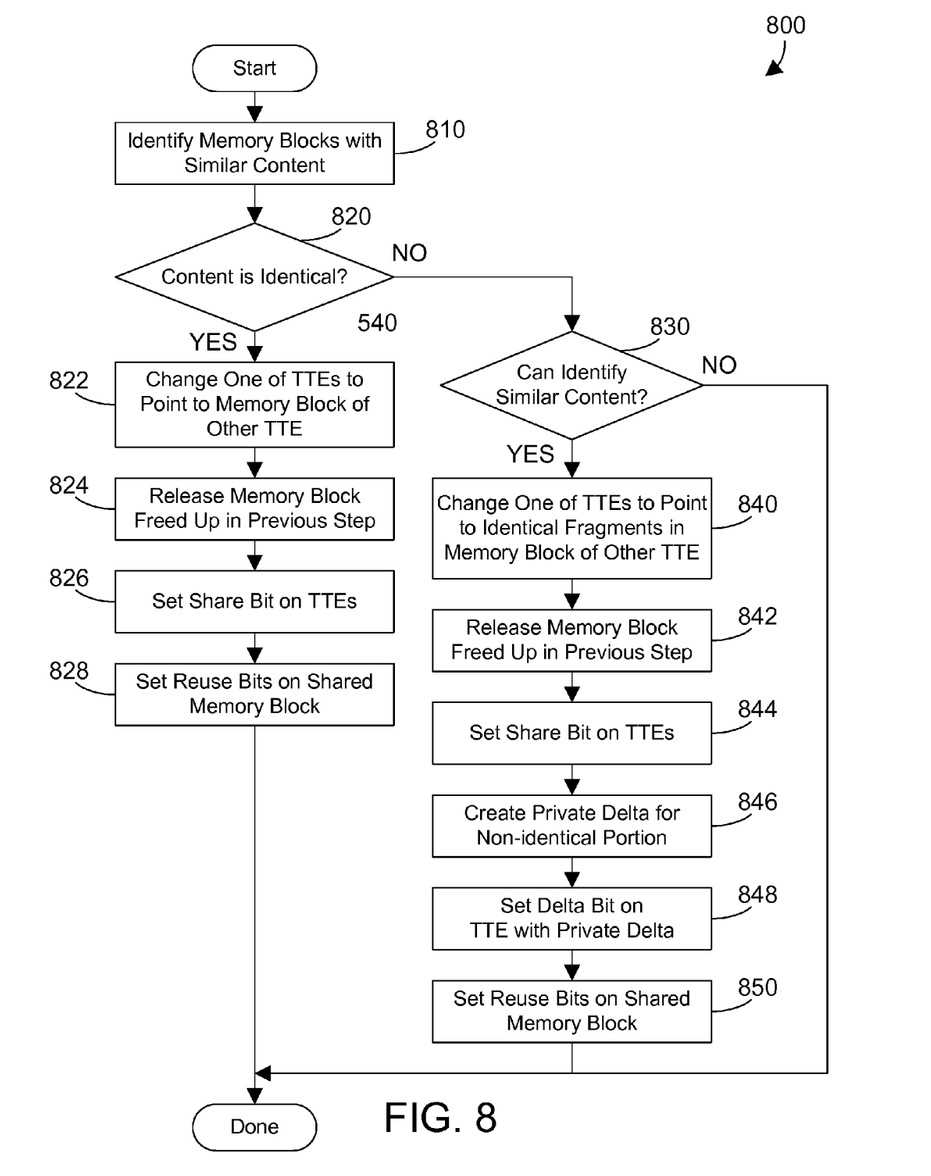
FIG. 8 is a flow diagram of a method for compressing data in memory.

Referring to FIG. 8, a method 800 is preferably performed by the reuse mechanism 124 shown in FIG. 1. Memory blocks with similar content are identified (step 810). When the content is identical (step 820=YES), one of the translation table entries that points to one of the memory blocks is changed to point to the memory block referenced by the other translation table entry (step 822). As a result, one or more fragments in the memory block that were previously referenced are freed up. The fragment(s) freed up as a result of performing step 822 are then released (step 824). The share bit on the translation table entries that share the memory block are set (step 826), and the reuse bits on the shared memory block are set (step 828) to indicate the number of translation table entries that share (or reuse) the shared memory block. When the content in translation table entries is similar but not identical (step 820=NO), when the similar content cannot be identified (step 830=NO), method 800 is done. When the similar content can be identified (step 830=YES), one of the translation table entries is changed to point to one or more identical fragment(s) in the memory block of the translation table entry (step 840). Any memory fragments released as a result of performing step 840 are released (step 842). The share bit on the translation table entries that share the memory block are set (step 844). A private delta is then created for the non-identical portion (step 846). The delta bit is set on the translation table entry with the private delta (step 848). The reuse bits on the shared memory block are then set (step 850) to indicate the number of translation table entries that share (or reuse) the shared memory block. Method 800 is then done.

Determining when memory blocks are identical in step 820 and when similar content can be identified in step 830 may be performed in any suitable way. One possible way is shown in method 900 in FIG. 9. A digital signature is generated for each memory block (step 910). The signatures for two memory blocks are then compared (step 920). When the signatures are identical (step 930=YES), the memory blocks are identical (step 950). When the signatures are not identical (step 930=NO), the memory blocks are different (step 940). Method 900 thus shows one suitable way to identify memory blocks with similar content (step 810) and identical content (step 820=YES).

Figure 9:
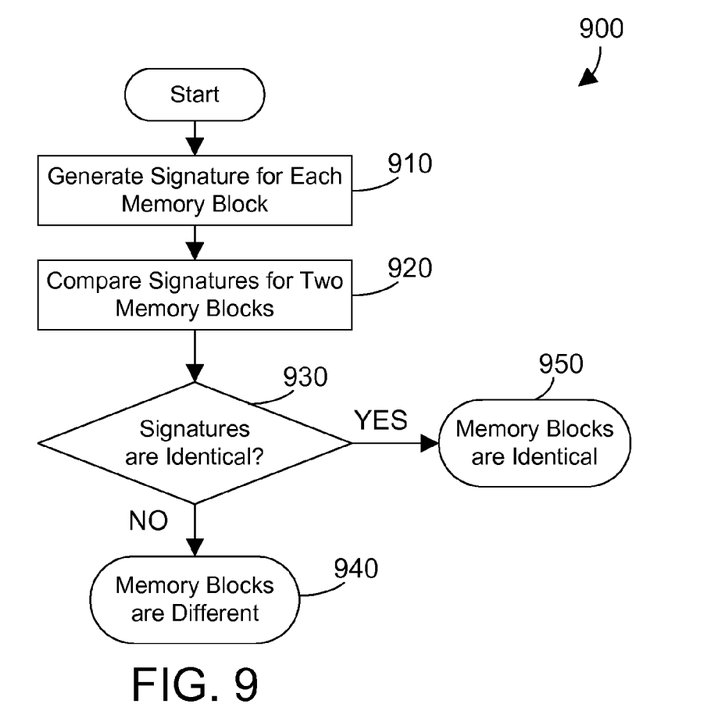
FIG. 9 is a flow diagram of a method for determining whether memory blocks are identical or not.
Figure 10:
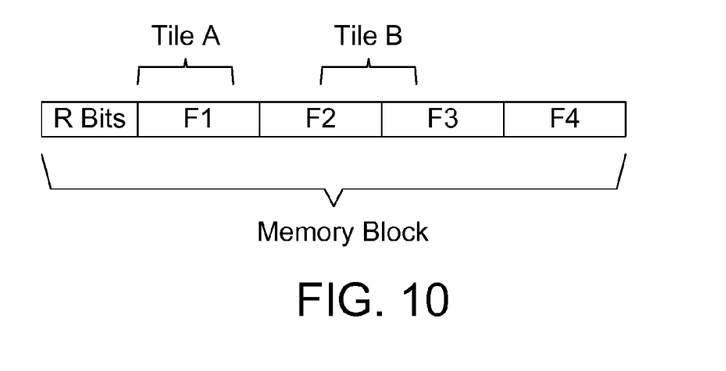
FIG. 10 is a block diagram showing two possible tiles for a memory block.

The digital signature generated in step 910 in FIG. 9 may be generated in any suitable way. One way is generate the digital signature using a tile that is defined as the first M bytes of the memory block. For example, FIG. 10 shows a Tile A that comprises the first M bytes of the memory block. Note the reuse bits R Bits in FIG. 10 are not included in the tile because the value of the reuse bits changes over time. One way to generate a digital signature for the memory block in FIG. 10 is to compute a hash value for Tile A. If two memory blocks are identical, their respective tile's hashes will also be identical. However, when two memory blocks are not identical but similar, then two different cases are possible using the hash value over Tile A shown in FIG. 10 as the digital signature. First, when the differences between two memory blocks are outside their respective tiles (e.g., Tile A shown in FIG. 10), the differences in the two memory blocks will not affect the digital signatures, so the digital signatures of the two memory blocks will match. This is the case in FIG. 8 when the content is not identical (step 820=NO) but the similar content can be identified (step 830=YES). In the second case, when the differences between the two memory blocks are inside their respective tiles, the differences cause the digital signatures not to match, so the similar content cannot be identified (step 830=NO in FIG. 8). By generating a digital signature over a tile that is a subset of the bytes in the memory block, it is possible that similar content will not be identified.

A similar problem exists when a memory block includes much of the same data as another memory block, but the data is shifted or permuted. For example, suppose the contents of first and second memory blocks is identical, except the first memory block has 1 byte inserted at the beginning and the last byte removed. A digital signature computed over Tile A as shown in FIG. 10 will hash to different values for the two memory blocks, therefore missing the opportunity to detect the similarity. This type of shifted permuted data may occur frequently in file systems. Similarly, in database systems, nearly identical records of sizes other than the size of the memory block may be found in storage at arbitrary addresses.

Figure 11:
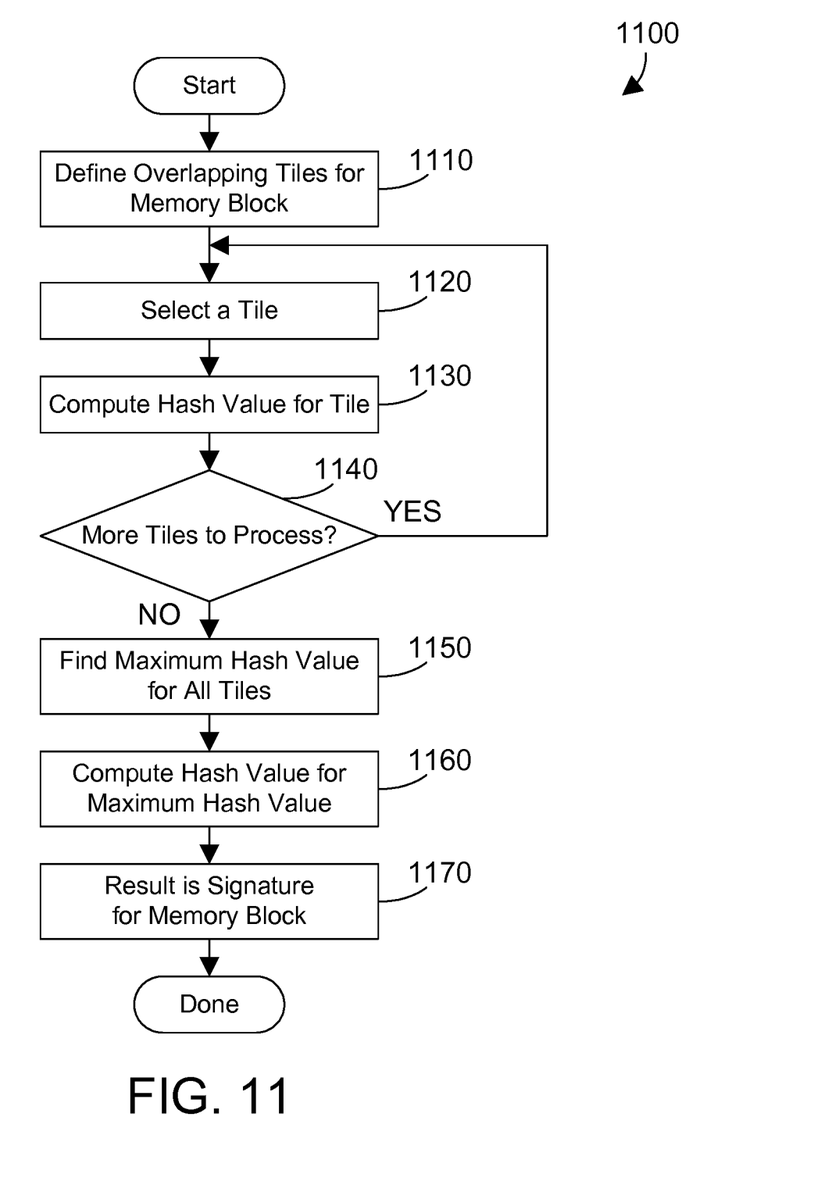
FIG. 11 is a flow diagram of a method for computing a signature for a memory block from multiple tiles.

For identifying memory blocks with shifted and/or permuted content, method 1100 in FIG. 11 may be used. Overlapping tiles are defined for a memory block (step 1110). In one specific implementation, for a 1 KB memory block, there are 1024-N+1 overlapping tiles of N bytes each. A tile is selected (step 1120). A hash value is computed for the tile (step 1130). When there are more tiles to process (step 1140=YES), method 1100 loops back to step 1120 and continues. When all tiles have been processed (step 1140=NO), the maximum hash value for all tiles is found (step 1150). A hash value for the maximum hash value is then computed (step 1160), and the result is the digital signature for the memory block (step 1170). By computing hash values as shown in FIG. 11, memory blocks with shifted or permutes data may be detected. This is the case when the content is not identical (step 820=NO) but the similar content can be identified (step 830=YES), as shown in FIG. 8. After identifying similar content, a private delta may be generated that takes substantially less storage space than a full translation table entry.

Figure 12:
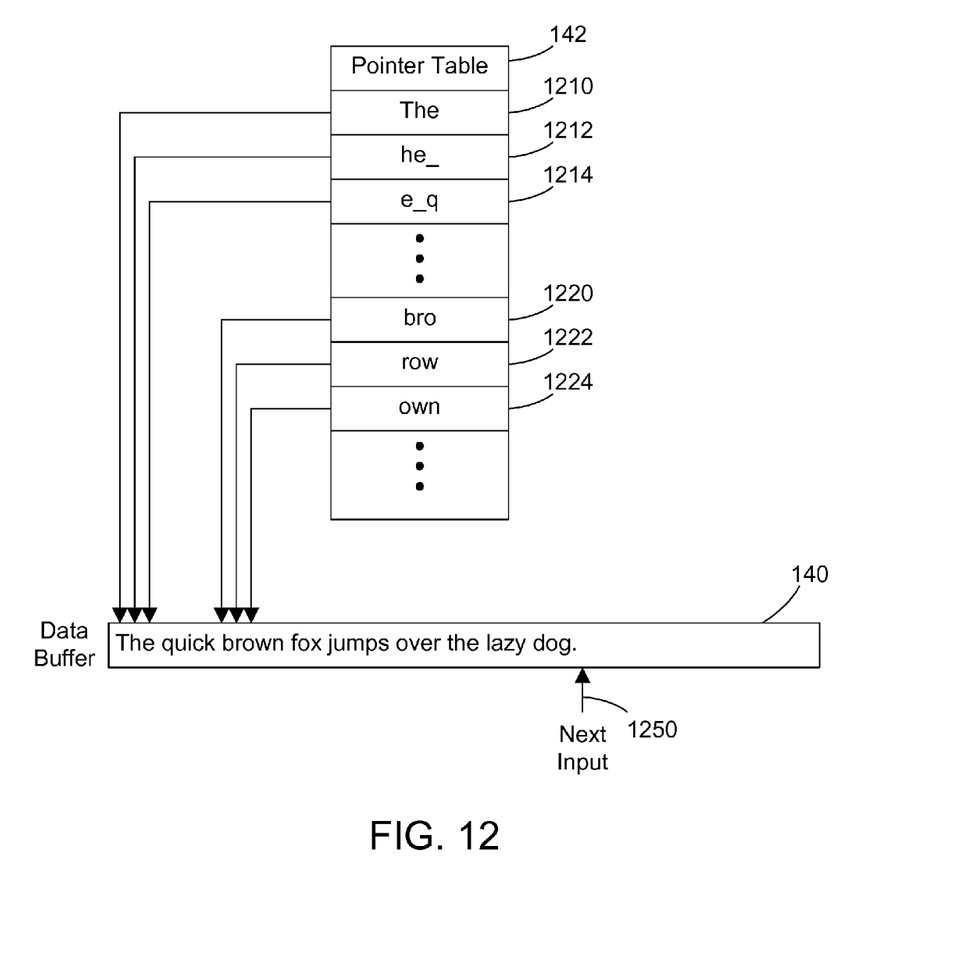
FIG. 12 is a block diagram showing the processing of data in a data buffer.
Figure 13:
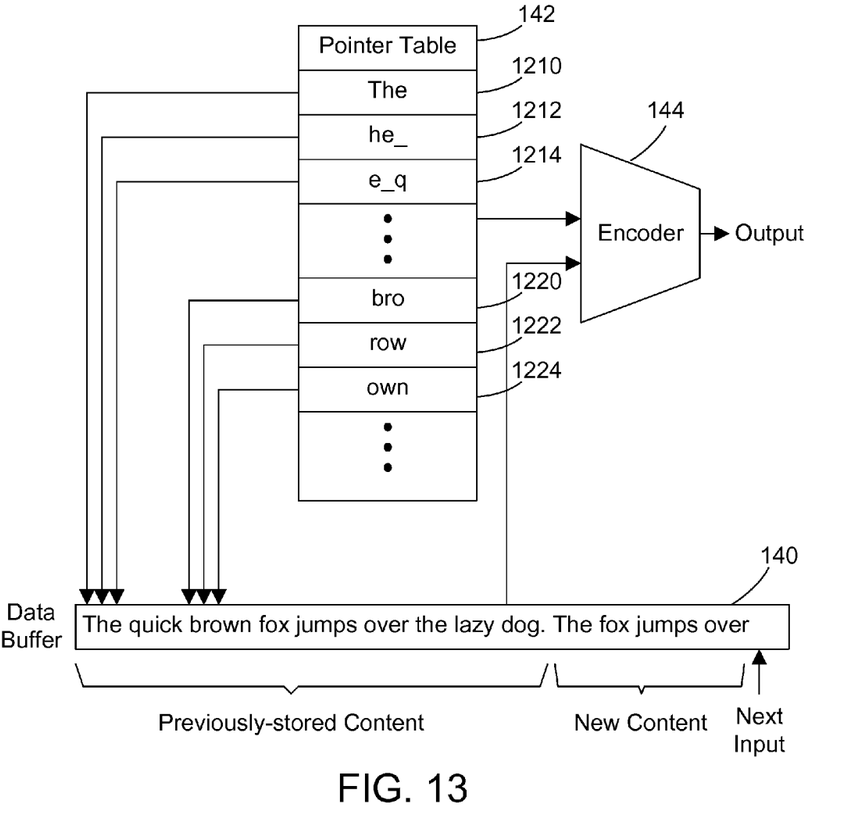
FIG. 13 is a block diagram showing the generation of an encoded output based on previously-stored content in the data buffer.
Figure 14:
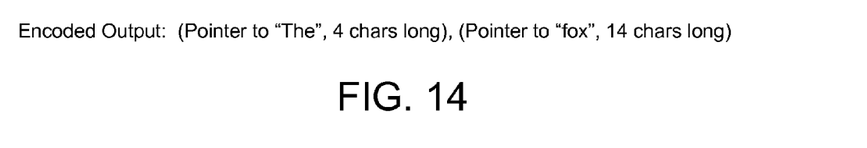
FIG. 14 is a diagram showing the encoded output for the second phrase in the data buffer shown in FIG. 13 that is a private delta based on previously-stored content in the data buffer.

One specific method for identifying similar content and generating a private delta is shown in FIGS. 12-14. Referring to FIG. 12, a data buffer 140 receives content, and a pointer table 142 is generated to point to the content stored in data buffer 140. In the simple example shown in FIGS. 12-14, the data stored in the data buffer is text, and the pointer table 142 includes pointers that include each three-letter sequence in the data buffer. Thus, the first pointer 1210 in the pointer table 142 points to the first three characters in the data buffer 140, namely "The". The second pointer 1212 in the pointer table 142 points to the three characters in the data buffer 140 beginning with the second character, namely "he_", where the underscore "_" represents a space. The third pointer 1214 in the pointer table 142 points to the three characters in the data buffer 140 beginning with the third character, namely "e_q". Three other pointers 1220, 1222 and 1224 are shown in FIGS. 12 and 13 that point to the three-letter sequences "bro", "row", and "own", respectively. Note the data buffer 140 includes a next input pointer 1250 that identifies where the next data will be stored in the data buffer 140. Referring to FIG. 13, the next phrase "The fox jumps over" is then stored in the data buffer 140 as new content. The previously-stored data in the data buffer 140 is searched for similar content by searching the pointer table 142. Because the first entry 1210 in the pointer table includes "The", which matches the first three letters "The" in the new content in the data buffer, the encoder 144 specifies the first pointer 1210. A comparison is then made between the previously-stored content and the new content, and it is discovered that four characters are identical, namely "The_", where the "_" represents a space. The fifth character "f" in the new content is not identical to the fifth character "q" in the previously-stored content. Thus, the encoder 144 generates an output that includes the pointer 1210, and a length of four characters, thereby specifying "The_" in the previously-stored content in the data buffer 140. Next, the pointer table is searched for a match for the next three letters of the new content, namely "fox". A pointer is located in the pointer table that points to the word "fox" in the previously-stored content. A comparison is then made between the previously-stored content and the new content, and it is discovered that fourteen characters are identical, namely "fox jumps over". The encoder 144 thus generates an encoded output that specifies the pointer to "fox" in the previously-stored content, with a length of 14 characters. The resulting encoded output is shown in FIG. 14. The encoder 144 thus generates a delta in terms of previously-stored content, thereby allowing a translation table entry to share fragments of a memory block, as described in detail above with respect to FIG. 7.

Figure 7:
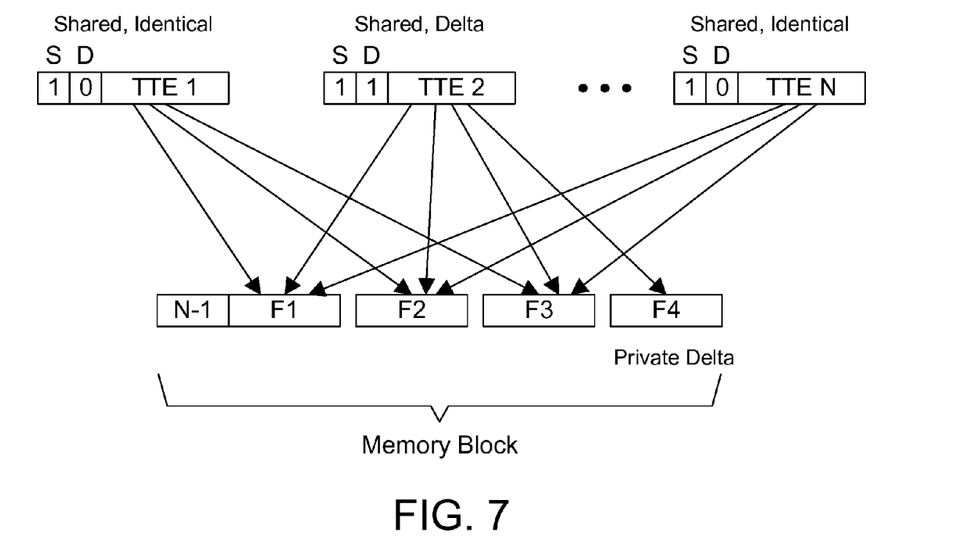
FIG. 7 is a block diagram showing N translation table entries that share a single memory block, with one of the translation table entries having a private delta.
Figure 15:
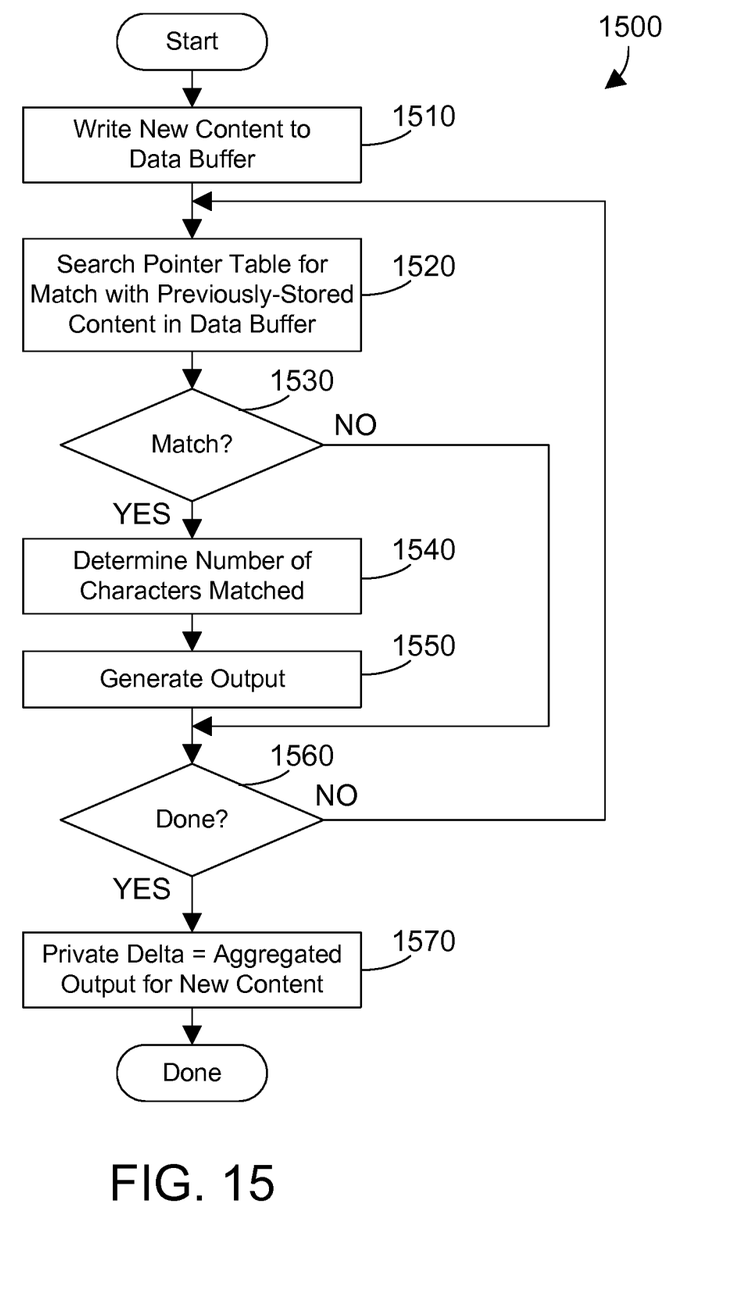
FIG. 15 is a flow diagram of a method for generating a private delta.

The data buffer 140, pointer table 142, and encoder 144 shown in FIGS. 12 and 13 could be used to generate a private delta shown in FIG. 14, which is representative of a private delta such as memory fragment F4 shown in FIG. 7. This method of generating a private delta allows sharing memory fragments with other translation table entries, even when the common content is shifted or permuted. Referring to FIG. 15, a method 1500 is preferably performed by the reuse mechanism 124 shown in FIG. 1 to generate a private delta. Method 1500 begins when new content is written to the data buffer (step 1510). The pointer table is searched for a match with previously-stored content in the data buffer (step 1520). When a match is found (step 1530=YES), the number of matched characters is determined (step 1540), and output is generated (step 1550). The output generated in step 1550 may take the form of a pointer/length pair as shown in FIG. 14 and described above, with a pointer to the first matching content and a length of a number of characters that match. If there is more content in the new content to analyze (step 1560=NO), method 1500 loops back to step 1520 and continues. When no more matches are found (step 1530=NO) and there is no more of the new content to process (step 1560=YES), the private delta is generated by aggregating the output for each portion of the new content that matched existing content in the data buffer (step 1570). For example, FIG. 14 shows a private delta that comprises two pointer/length pairs that are aggregated together. Generating a private delta as described and claimed herein allows translation table entries to share common memory fragments even when data in the common memory fragments is shifted or permuted, because the private delta can account for the shifted or permuted data.

While the simple example in FIGS. 12-14 is shown and described by way of example, one of ordinary skill in the art will recognize the data buffer 140 may include any suitable data, and the pointer table 142 may include pointers that have any suitable number of characters. For example, the data buffer 140, pointer table 142, and encoder 144 as shown in FIGS. 12 and 13 could be used to generate a delta for a computer file that does not contain text. The disclosure and claims herein expressly extend to generating a delta for new content based on previously-stored content that saves space in storing the new content, and allows a private delta to specify differences between data that is common with other translation table entries.

The translation table described and claimed herein has entries that each include a share bit and a delta bit, with pointers that point to a memory block that includes reuse bits. When two translation table entries reference identical fragments in a memory block, one of the translation table entries is changed to refer to the same memory block referenced in the other translation table entry, which frees up a memory block. The share bit is set to indicate a translation table entry is sharing its memory block with another translation table entry. In addition, a translation table entry may include one or more pointers that reference fragments in a memory block that are shared with other translation table entries, along with a private delta in the form of a pointer that references a memory fragment in the memory block that is not shared with other translation table entries. When a translation table has a private delta, its delta bit is set. The private delta is generated by analyzing a data buffer for content that is similar to previously-stored content, and by providing the private delta in the form of an encoded output that references previously-stored content. A higher degree of data compression is possible because multiple translation table entries that reference identical or similar memory blocks may be combined, which frees up memory blocks that would otherwise be occupied.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A method for performing compression on data stored in a memory that includes a plurality of memory blocks, the method comprising the steps of:
   providing a translation table having a plurality of translation table entries, each translation table entry having a share bit, a delta bit and a plurality of pointers that each point to a memory fragment in a memory block in the memory, wherein the share bit is set on a first translation table entry when the first translation table entry includes at least one pointer that points to a memory fragment in the memory block that is shared with a second translation table entry and the delta bit on the first translation table entry is set when the first translation table entry includes the at least one pointer that points to the memory fragment in the memory block that is shared with the second translation table entry and when the first translation table entry includes at least one pointer that points to a different memory fragment in the memory block that is not shared with the second translation table entry;
   identifying first and second memory blocks with identical content;
   changing a first translation table entry corresponding to the first memory block to point to at least one memory fragment in the second memory block;
   releasing at least one memory fragment that was freed up when the first translation table entry was changed to point to the at least one memory fragment in the second memory block;
   setting the share bit of the first and second translation table entries corresponding to the first and second memory blocks;
   generating a private delta in the different memory fragment in the memory block that is not shared with the second translation table entry, wherein the private delta references previously-stored content;
   setting the delta bit on the first translation table entry when the first translation table entry includes a pointer that points to the private delta; and
   clearing the delta bit on the first translation table entry when the first translation table entry does not include a pointer that points to the private delta.

2. The method of claim 1 further comprising the step of clearing the share bit on the first translation table entry when the first translation table entry does not share any memory fragments with any other translation table entry.

3. The method of claim 1 further comprising:
   setting the share bits and clearing the delta bits of the first and second translation table entries when the first and second translation table entries have all pointers that point to memory fragments that are all shared by the first and second translation table entries;
   setting the share bits of the first and second translation table entries, setting the delta bit of the first translation table entry, and clearing the delta bit of the second translation table entry when the first translation table entry includes at least one pointer that points to a memory fragment in the memory block that is shared with the second translation table entry and when the first translation table entry includes at least one pointer that points to a different memory fragment in the memory block that is not shared; and
   clearing the share bits and delta bits of the first and second translation table entries when the plurality of pointers in the first translation table entry point to different memory blocks than the plurality of pointers in the second translation table entry.

4. The method of claim 1 further comprising the step of generating a digital signature for each of the plurality of memory blocks, wherein the step of identifying first and second memory blocks with identical content is performed by comparing a digital signature for the first memory block with a digital signature for the second memory block.

5. The method of claim 4 wherein the digital signature for a selected memory block comprises a hash value computed for a tile of bytes of the selected memory block, wherein the tile of bytes comprises a subset of contiguous bytes of the selected memory block.

6. The method of claim 3 wherein the step of generating the digital signature comprises the steps of:
   defining a plurality of overlapping tiles of bytes for the selected memory block;
   computing a hash value for each overlapping tile of bytes;
   determining a maximum hash value for the plurality of overlapping tiles of bytes;
   computing a second hash value for the maximum hash value; and
   using the second hash value as the digital signature for the selected memory block.

7. A method for generating a private delta for a second translation table entry that points to a memory that includes a plurality of memory blocks, wherein the second translation table entry is part of a translation table having a plurality of translation table entries, each translation table entry having a share bit, a delta bit and a plurality of pointers that each point to a memory fragment in a memory block in the memory, wherein the share bit is set on a first translation table entry when the first translation table entry includes at least one pointer that points to a memory fragment in the memory block that is shared with a second translation table entry and the delta bit on the first translation table entry is set when the first translation table entry includes the at least one pointer that points to the memory fragment in the memory block that is shared with the second translation table entry and when the first translation table entry includes at least one pointer that points to a different memory fragment in the memory block that is not shared with the second translation table entry, the method comprising the steps of:

generating a digital signature for each of the plurality of translation table entries, wherein the digital signature for a selected translation table entry comprises a hash value computed for a tile of bytes of the selected translation table entry, wherein the tile of bytes comprises a subset of contiguous bytes of the selected translation table entry;

identifying first and second memory blocks with identical content by comparing a digital signature for the first memory block with a digital signature for the second memory block, wherein the first and second memory blocks have corresponding first and second translation table entries;

changing a first translation table entry corresponding to the first memory block to point to at least one memory fragment in the second memory block;

releasing at least one memory fragment that was freed up when the first translation table entry was changed to point to the at least one memory fragment in the second memory block;

setting the share bit of the translation table entries corresponding to the first and second memory blocks;

generating a private delta in the different memory fragment in the memory block that is not shared with the second translation table entry, wherein the private delta references previously-stored content;

clearing the share bit on the first translation table entry when the first translation table entry does not share any memory fragments with any other translation table entry;

clearing the share bit on the second translation table entry when the second translation table entry does not share any memory fragments with any other translation table entry;

setting the delta bit on the first translation table entry when the first translation table entry includes at least one pointer that points to the memory fragment in the memory block that is shared with the second translation table entry and when the first translation table entry includes at least one pointer that points to the different memory fragment in the memory block that is not shared with the second translation table entry;

clearing the delta bit on the first translation table entry when the first translation table entry does not include the at least one pointer that points to the different memory fragment in the memory block that is not shared with the second translation table entry; and setting the reuse bits in a memory block shared by the first and second translation table entries to indicate a number of the plurality of translation table entries that share the at least one memory fragment in the memory block.

8. The method of claim 7 wherein the step of generating the digital signature comprises the steps of:

defining a plurality of overlapping tiles of bytes for the selected memory block;

computing a hash value for each overlapping tile of bytes;

determining a maximum hash value for the plurality of overlapping tiles of bytes;

computing a second hash value for the maximum hash value; and using the second hash value as the digital signature for the selected memory block.

9. The method of claim 7 further comprising:

setting the share bits and clearing the delta bits of the first and second translation table entries when the first and second translation table entries have all pointers that point to memory fragments that are all shared by the first and second translation table entries;

setting the share bits of the first and second translation table entries, setting the delta bit of the first translation table entry, and clearing the delta bit of the second translation table entry when the first translation table entry includes at least one pointer that points to a memory fragment in the memory block that is shared with the second translation table entry and when the first translation table entry includes at least one pointer that points to a different memory fragment in the memory block that is not shared; and clearing the share bits and delta bits of the first and second translation table entries when the plurality of pointers in the first translation table entry point to different memory blocks than the plurality of pointers in the second translation table entry.

* * * * *